United States Patent
Smith

(10) Patent No.: US 7,005,929 B2
(45) Date of Patent: Feb. 28, 2006

(54) LOOP FILTER WITH ACTIVE CAPACITOR AND METHOD FOR GENERATING A REFERENCE

(75) Inventor: Malcolm H. Smith, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 123 days.

(21) Appl. No.: 10/726,166

(22) Filed: Dec. 2, 2003

(65) Prior Publication Data

US 2005/0116782 A1   Jun. 2, 2005

(51) Int. Cl.
*H03K 5/00* (2006.01)
*H03L 7/085* (2006.01)

(52) U.S. Cl. .................... 331/17; 331/25; 327/157; 327/558; 327/344

(58) Field of Classification Search ........ 327/156–158, 327/558, 311, 344; 331/17, 25
See application file for complete search history.

(56) References Cited

U.S. PATENT DOCUMENTS

| | | | | |
|---|---|---|---|---|
| 5,424,689 A | * | 6/1995 | Gillig et al. ................ | 331/17 |
| 5,557,242 A | * | 9/1996 | Wetherell ................ | 331/17 |
| 5,686,866 A | * | 11/1997 | Badger ................ | 331/17 |
| 6,344,772 B1 | * | 2/2002 | Larsson ................ | 327/552 |
| 6,693,494 B1 | * | 2/2004 | Fan ................ | 331/17 |

FOREIGN PATENT DOCUMENTS

JP    09294051 A   *  4/1996

OTHER PUBLICATIONS

Shu, Keliu, et al., "2.4-GHz monolithic fractional-N frequency synthesizer with robust phase-switching prescaler and loop capacitance multiplier", *IEEE Journal of Solid-State Circuits,* 38(6), (Jun. 2003), 866-875.

Shu, Keliu, et al., "A 16mW, 2.23-2.45GHz fully integrated Sigma Delta PLL with novel prescaler and loop filter in 0.35 mu m CMOS", *2003 IEEE Radio Frequency Integrated Circuits (RFIC) Symposium. Digest of Papers,* Philadelphia, Pennsylvania, Jun. 8-10, 2003, 181-184.

* cited by examiner

*Primary Examiner*—Dinh T. Le
(74) *Attorney, Agent, or Firm*—Schwegman, Lundberg, Woessner & Kluth, P.A.

(57) ABSTRACT

A loop filter for a frequency synthesizer provides a lower frequency pole with a smaller capacitor than conventional filters. The loop-filter comprises a resistor and a smaller capacitor in a series-feedback path, and a transconductor to sense a voltage across the resistor to either source or sink additional current proportional to the sensed voltage. The transconductor and the smaller capacitor may provide a larger capacitance. The loop filter also may comprise an operational amplifier having the smaller capacitor and the resistor in the series-feedback path to receive pulses from a charge pump. The filter may integrate the pulses and may generate a control voltage related to a width of the pulses.

32 Claims, 3 Drawing Sheets

LOOP FILTER WITH ACTIVE CAPACITOR AND METHOD FOR GENERATING A REFERENCE

TECHNICAL FIELD

Some embodiments of the present invention pertain to electronic circuits, some embodiments relate to filters, and some embodiments relate more specifically to loop filters for frequency synthesizers.

BACKGROUND

Filters conventionally utilize a combination of circuit elements, such as capacitors, to help provide one or more poles and zeros for the filter. One problem with conventional filters is that a large capacitance may be required to provide a lower frequency pole. In frequency synthesizer applications, a large capacitor may also be used to help reduce noise. A large capacitor unfortunately consumes a significant portion of chip area. In some conventional filters, this capacitor is so large that it is fabricated off-chip. Large capacitors may reduce reliability and increase cost. Thus, there are general needs for filters that use smaller capacitors.

BRIEF DESCRIPTION OF THE DRAWINGS

The appended claims are directed to some of the various embodiments of the present invention. However, the detailed description presents a more complete understanding of embodiments of the present invention when considered in connection with the figures, wherein like reference numbers refer to similar items throughout the figures, and:

DETAILED DESCRIPTION

The following description and the drawings illustrate specific embodiments of the invention sufficiently to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. The scope of embodiments of the invention encompasses the full ambit of the claims and all available equivalents of those claims. Such embodiments of the inventive subject matter may be referred to, individually or collectively, herein by the term "invention" merely for convenience and without intending to voluntarily limit the scope of this application to any single invention or inventive concept if more than one is in fact disclosed.

Figure 1:
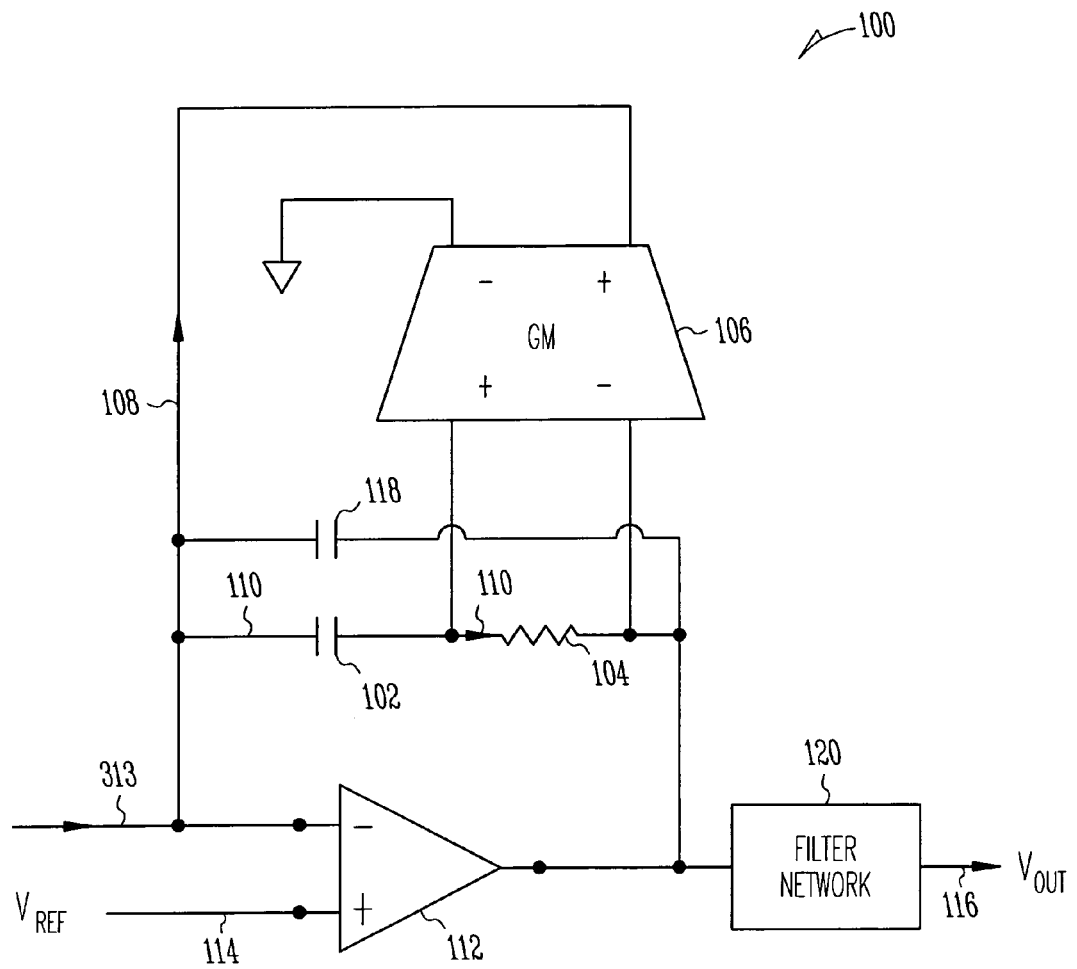
FIG. 1 is a circuit diagram of a filter in accordance with some embodiments of the present invention.

FIG. 1 is a circuit diagram of a filter in accordance with some embodiments of the present invention. Filter 100 may be suitable for use as a loop filter in a frequency synthesizer or phase-locked loop, although the scope of the present invention is not limited in this respect. Filter 100 may generate output voltage 116 in response to input signal 113.

In some embodiments, filter 100 may comprise capacitor 102 and resistor 104 in a series-feedback path, and transconductor 106. Transconductor 106 may sense a voltage across resistor 104 and may either source or sink additional current 108. Additional current 108 may be related to the sensed voltage, which is related to current 110 which may flow through resistor 104. The operation of transconductor 106 in conjunction with capacitor 102 allows filter 100 to function as a filter with a larger capacitance than the capacitance of capacitor 102 alone.

Filter 100 may further comprise amplifier 112 to receive input signal 113. Amplifier 112 may have capacitor 102 and resistor 104 in the series-feedback path. In some embodiments, amplifier 112 may be an operational amplifier and may be referenced to reference voltage 114, although the scope of the invention is not limited in this respect.

In some embodiments, filter 100 may be a loop filter, and input signal 113 may comprise pulses of varying width. Filter 100 may integrate the pulses and generate output voltage 116 in relation to a width of the pulses. The larger capacitance provided by the operation of transconductor 106 in conjunction with capacitor 102 may provide a lower frequency pole for filter 100. Without the additional current sourced or sunk by transconductor 106, a larger capacitor in place of capacitor 102 would be required to provide the lower frequency pole. Resistor 104 may provide a zero for filter 100.

In some embodiments, filter 100 may further comprise capacitor 118 in a parallel feedback path of amplifier 112. Capacitor 118 may provide an additional pole of the filter. The additional pole may be greater in frequency than the frequency of the zero created by the larger capacitor and the resistor resulting from the operation of transconductor 106 and capacitor 102.

In some embodiments, capacitors 102 and 118 may have approximately the same capacitance value, although the scope of the invention is not limited in this respect. The values of capacitors 102 and 118 and of resistor 104 may be selected by those of ordinary skill in the art based on the performance requirements of filter 100. In some embodiments, capacitors 102 and 118 may have values ranging from 10's of picofarads (pF) to thousands of pF.

In some embodiments, the pulses comprising input signal 113 may be provided by a charge pump. In these embodiments, filter 100 may be a loop filter for a frequency synthesizer, and output voltage 116 may be a control voltage provided to a voltage-controlled oscillator (VCO). In these embodiments, a width of the pulses may be approximately proportional to either a frequency or a phase offset of the VCO. Additional current 108 (i.e., in addition to current 110) allows capacitor 102 to appear as a larger capacitance from the perspective of the charge pump which may be generating input signal 113. Among other things, the larger capacitance may help reduce noise which may be provided to a VCO.

In some embodiments, filter 100 may further comprise filter network 120 at an output of amplifier 112 to provide a higher frequency pole of filter 100, although the scope of the invention is not limited in this respect. The filter network may comprise a resistor-capacitor network, although other filter networks are also suitable.

In some embodiments, filter 100 comprises amplifier 112 and current mirror circuitry in a feedback path of amplifier 112. The current mirror circuitry may either source or sink additional current 108 proportional to current 110 through feedback path capacitor 102. In these embodiments, the operation of the current mirror in conjunction with capacitor 102 functions as a larger capacitance and may provide a lower frequency pole of the filter. In these embodiments, the series-feedback path comprises capacitor 102 and resistor 104 in series. The current mirror circuitry may be part of transconductor 106 to sense a voltage across resistor 104, although other current mirror circuitry may also be suitable. In these embodiments, amplifier 112 may be an operational amplifier referenced to reference voltage 114. In these embodiments, filter 100 may also comprise capacitor 118 to provide an additional pole of the filter. The frequency of the additional pole may be greater than a frequency of the lower frequency pole provided by the larger capacitance resulting from the operation of transconductor 106 and capacitor 102.

In some embodiments, the referencing of amplifier 112 to reference voltage 114 may allow an output of a charge pump providing input signal 113 to be held to approximately the reference voltage, enhancing the accuracy of output voltage 116 and increasing the dynamic range. In some embodiments, the output of the charge pump may be held at a virtual ground by amplifier 112 which may help ensure that the output impedance of the charge pump does not significantly affect the response of filter 100. This may also help improve the linearity of the response of filter 100.

In some embodiments, additional current 108 may be a function of the transconductance (Gm) of transconductor 106, the resistance (R) of resistor 104 and current 110 (Icap). For example, current 108 may be approximately equal to GmxRxIcap, although the scope of the invention is not limited in this respect. The additional capacitance provided by the operation of transconductor 106 may, for example, be two or more times the capacitance provided by capacitor 102.

In some embodiments, filter 100 may be a loop filter in a reference frequency generator such as a phase-locked loop, although the scope of the invention is not limited in this respect. In some embodiments, the phase-locked loop may be an offset loop phase-locked loop which may be used to generate a phase component for a phase modulator in a digital wireless communication device that may transmit and/or receive phase modulated signals, although the scope of the invention is not limited in this respect.

Figure 2:
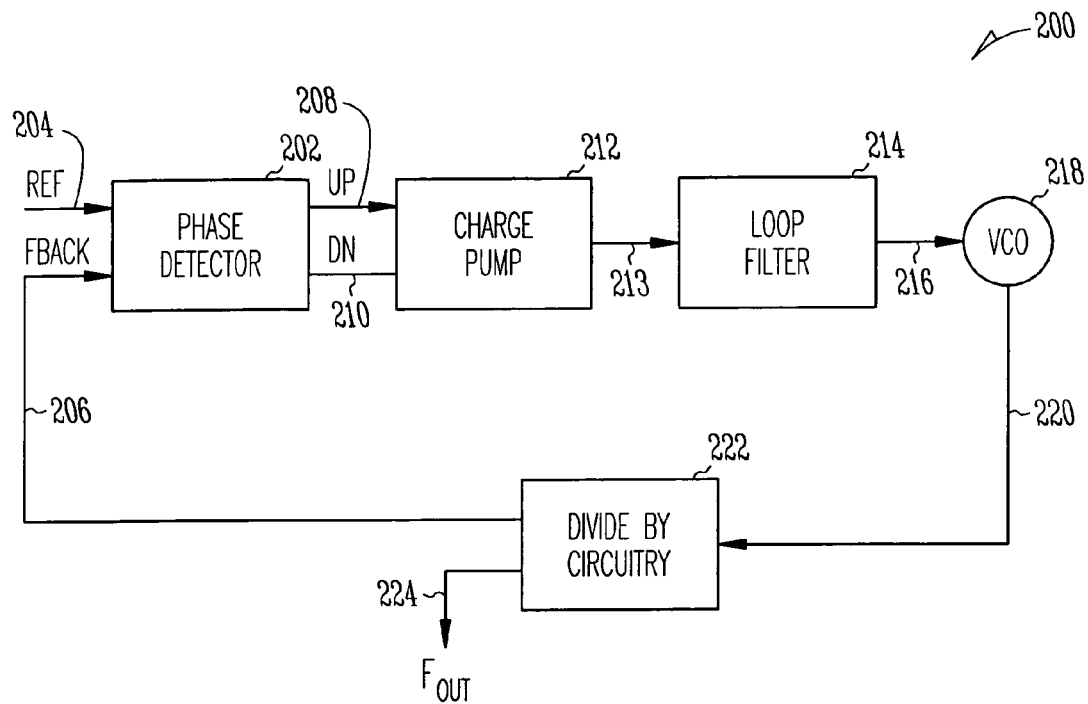
FIG. 2 is a block diagram of a frequency synthesizer in accordance with some embodiments of the present invention.

FIG. 2 is a block diagram of a frequency synthesizer in accordance with some embodiments of the present invention. Frequency synthesizer 200 may generate output signal 224 in response to reference signal 204. In some embodiments, frequency synthesizer 200 may be a phase-locked loop, although the scope of the invention is not limited in this respect. In some embodiments, frequency synthesizer 200 may be used for, among other things, frequency synthesis, frequency multiplication, pulse synchronization, tone decoding, AM and FM modulation and demodulation, and phase modulation and demodulation. Frequency synthesizer 200 may include phase detector 202 to detect a phase difference between reference signal 204 and feedback signal 206. Phase detector 202 may control charge pump 212 through signals 208 and 210 to either charge or discharge loop filter 214 by providing input signal 213, which may comprise pulses. Loop filter 214 may integrate input signal 213 to generate control voltage 216. Signals 208 and 210 may include pulses having a width proportional to a phase difference between signals 204 and 206, although the scope of the invention is not limited in this respect. In some embodiments, reference signal 204 may be provided by suitable circuitry of a transceiver, such as a baseband processor, although the scope of the invention is not limited in this respect.

Control voltage 216 may be provided to voltage-controlled oscillator (VCO) 218, which may generate frequency output 220 in response to control voltage 216. In some embodiments, output signal 224 may comprise an output frequency signal having a 50% duty cycle clock. In these embodiments, frequency output 220 may be divided by an integer in divide-by circuitry 222. In some embodiments, frequency output 220 may be further divided to generate feedback signal 206, although the scope of the invention is not limited in this respect. In some embodiments, phase detector 202 generates signals 208 and 210 to drive charge pump 212 to set the proper loop-filter control voltage 216 to maintain a small phase error between the signals 204 and 206 applied to phase detector 202.

In some embodiments, frequency synthesizer 200 may be part of a wireless communication device, although the scope of the invention is not limited in this respect. Although frequency synthesizer 200 is illustrated as having several separate functional elements, one or more of the functional elements may be combined and may be implemented by combinations of software and/or hardware configured elements.

In accordance with some embodiments of the present invention, loop filter 100 (FIG. 1) may be suitable for use as loop filter 214, although other loop filters may also be suitable. In some embodiments, loop filter 214 may comprise a capacitor and resistor in a series-feedback path, and a transconductor to sense a voltage across the resistor to either source or sink additional input current for the charge pump proportional to the sensed voltage. The operation of the transconductor in conjunction with the capacitor functions as a larger capacitance than the capacitor alone.

In some embodiments, loop filter 214 may comprise an operational amplifier and a current mirror in a feedback path of the amplifier to either source or sink additional current proportional to current through a feedback path capacitor. In these embodiments, the operation of the current mirror in conjunction with the capacitor functions as a larger capacitance than the capacitor alone. In these embodiments, the series-feedback path may comprise the capacitor and a resistor in series. The current mirror may be part of a transconductor to sense a voltage across the resistor to either source or sink the additional current proportional to the sensed voltage.

In some embodiments, frequency synthesizer 200 may comprise an integer-N frequency synthesizer. In these embodiments, frequency synthesizer 200 may comprise divide-by circuitry 222 to receive frequency output 220 from VCO 218 and to divide frequency output 220 by an integer value to provide output signal 224. The integer value (N) may be, for example, almost any even integer.

In some embodiments, frequency synthesizer 200 may comprise a fractional-N frequency synthesizer. In these embodiments, frequency synthesizer 200 further comprises divide-by circuitry 222 to receive frequency output 220 from VCO 218 and to divide frequency output 220 by a non-integer value to provide output signal 224. For example, output signal 224 may comprise a signal of a fractional or odd integer value (e.g., 3× or ⅓) of frequency output 220.

Figure 3:
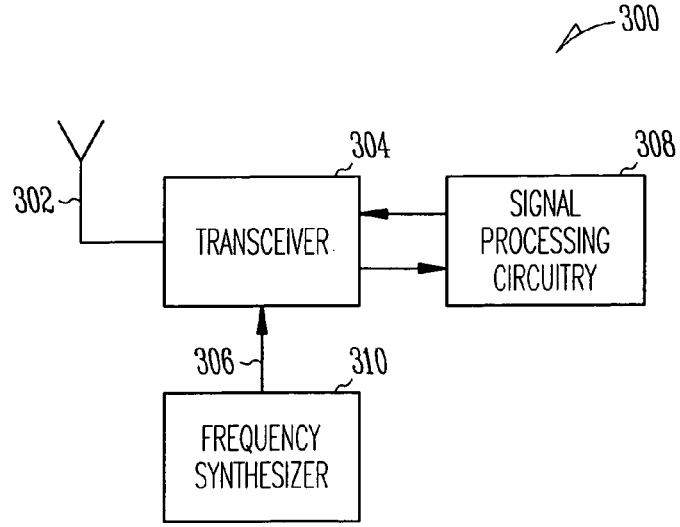
FIG. 3 is a block diagram of a wireless communication device in accordance with some embodiments of the present invention.

FIG. 3 is a block diagram of a wireless communication device in accordance with some embodiments of the present invention. Communication device 300 may receive and/or transmit radio frequency (RF) communications using antenna 302. RF signals received from antenna 302 may be down-converted in transceiver 304 and provided to signal processing circuitry 308. Transceiver 304 may also up-convert signals from signal processing circuitry 308 for transmission by antenna 302. Frequency synthesizer 310 may provide reference signal 306 to transceiver 304 for down-converting signals, up-converting signals, phase modulating signals, phase demodulating signals, amplitude modulating signals, amplitude demodulating signals, frequency modulating signals, and/or frequency demodulating signals, among other things.

Wireless communication device 300 may be a personal digital assistant (PDA), a laptop or portable computer with wireless communication capability, a web tablet, a wireless telephone, a wireless headset, a pager, an instant messaging device, an MP3 player, a digital camera, an access point or other device that may receive and/or transmit information wirelessly.

In some embodiments, transceiver 304 may transmit and/or receive RF communications in accordance with specific communication standards, such as the IEEE 802.11(a), 802.11(b), 802.11(g/h) and/or 802.16 standards for wireless local area network communications, although the scope of the invention is not limited in this respect. In some embodiments, transceiver 304 may be suitable to transmit and/or receive communications in accordance with other techniques including the Digital Video Broadcasting Terrestrial (DVB-T) broadcasting standard, and the High performance radio Local Area Network (HiperLAN) standard. Antenna 302 may comprise a directional or onmidirectional antenna, including, for example, a dipole antenna, a monopole antenna, a loop antenna, a microstrip antenna or other type of antenna suitable for reception and/or transmission of RF signals.

In accordance with some embodiments of the present invention, frequency synthesizer 200 (FIG. 2) may be suitable for use as frequency synthesizer 310, although other frequency synthesizers may also be suitable. In some embodiments, frequency synthesizer 310 comprises a charge pump and a loop filter. The loop filter may comprise a capacitor and resistor in a series-feedback path, and a transconductor to sense a voltage across the resistor to either source or sink additional input current for the charge pump proportional to the sensed voltage. The operation of the transconductor in conjunction with the capacitor functions effectively as a larger capacitance than the capacitor alone.

In some embodiments, transceiver 304 may be a direct down conversion receiver. In these embodiments, reference signal 306 may comprise a radio frequency (RF) signal for converting received RF signals to signals of substantially zero frequency, although the scope of the invention is not limited in this respect.

In some other embodiments, transceiver 304 may be a superheterodyne receiver. In these embodiments, reference signal 306 may be a local-oscillator (LO) frequency for down-converting a received RF signal to one or more intermediate frequencies (IF) signals, although the scope of the invention is not limited in this respect.

In some other embodiments, transceiver 304 may be a polar transmitter to generate a phase component from reference signal 306. In these embodiments, the phase component may be used to generate a polar-modulated RF signal for transmission, such as a code-division multiplexed communication signal, although the scope of the invention is not limited in this respect.

In some other embodiments, transceiver 304 may be a digital transceiver which transmits and/or receives phase modulated signals. In these embodiments, reference signal 306 may be use generate a phase component to phase modulate signals for transmission.

Although communication device 300 is illustrated as a wireless communication device, device 300 may be almost any wireless or wireline communication device, including a general purpose processing or computing system. In some embodiments, device 300 may be a battery-powered device.

Although communication device 300 is illustrated as having several separate functional elements, one or more of the functional elements may be combined and may be implemented by combinations of software-configured elements, such as processing elements including digital signal processors (DSPs), and/or other hardware elements. For example, transceiver 304, signal-processing circuitry 308 and frequency synthesizer 310 may comprise one or more microprocessors, DSPs, application specific integrated circuits (ASICs), and combinations of various hardware and logic circuitry for performing at least the functions described herein.

Figure 4:
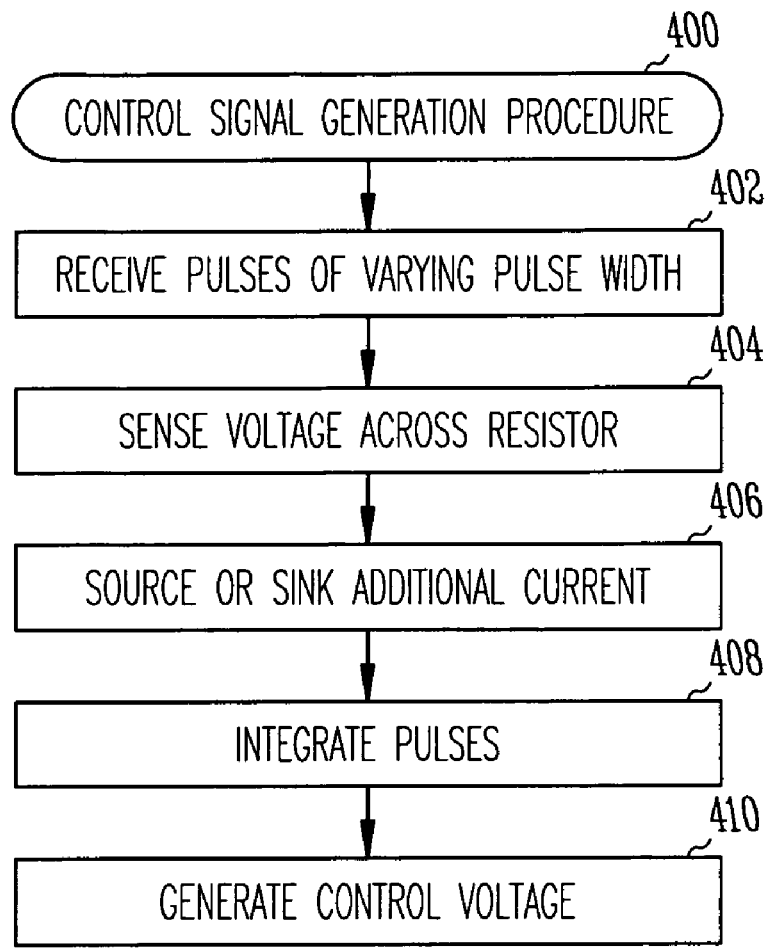
FIG. 4 is a flow chart of a control signal generation procedure in accordance with some embodiments of the present invention.

FIG. 4 is a flow chart of a control signal generation procedure in accordance with some embodiments of the present invention. Control signal generation procedure 400 may generate a control signal based on input signals. In some embodiments, control signal generation procedure 400 may generate a control signal for controlling a VCO based on pulses of varying pulse width received from a charge pump of a frequency synthesizer, although the scope of the invention is not limited in this respect. In some embodiments, procedure 400 may be performed by a filter, such as filter 100 (FIG. 1), although the scope of the invention is not limited in this respect.

Operation 402 receives pulses with an operational amplifier having a capacitor and resistor in a series-feedback path of the amplifier. Operation 404 determines the current flowing to or from the capacitor by sensing a voltage across the resistor. Operation 406 either sources or sinks additional current proportional to the sensed voltage. In some embodiments, operations 404 and 406 may be performed by a transconductor, such as transconductor 106 (FIG. 1).

Operation 408 integrates the received pulses, and operation 410 generates a control voltage related to the width of the pulses. In some embodiments, operation 402 comprises receiving pulses of varying width from a charge pump. In some embodiments, operations 404 through 408 may comprise providing a pole for a filter with a larger capacitance provided by operation of the transconductor in conjunction with the capacitor.

In some embodiments, operation 410 comprises providing the control voltage to a voltage-controlled oscillator. In these embodiments, the width of the pulses may be related to either a phase or frequency offset of the voltage-controlled oscillator.

Although the individual operations of procedure 400 are illustrated and described as separate operations, one or more of the individual operations may be performed concurrently and nothing requires that the operations be performed in the order illustrated.

Embodiments of the invention may be implemented in one or more of hardware, firmware and software. Embodiments of the invention may also be implemented as instructions stored on a machine-readable medium, which may be read and executed by at least one processor to perform the operations described herein. A machine-readable medium may include any mechanism for storing or transmitting information in a form readable by a machine (e.g., a computer). For example, a machine-readable medium may include read-only memory (ROM), random-access memory (RAM), magnetic disk storage media, optical storage media, flash-memory devices, electrical, optical, acoustical or other form of propagated signals (e.g., carrier wave, infrared signals, digital signals, etc.), and others.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims.

In the foregoing detailed description, various features are occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, inventive subject matter lies in less than all features of a single disclosed embodiment. Thus the following claims are hereby incorporated into the detailed description, with each claim standing on its own as a separate preferred embodiment.

What is claimed is:

1. A filter having an input and an output comprising:
   a capacitor and resistor coupled between the input and the output in a series-feedback path, the capacitor being coupled to the input of the filter, the resistor being coupled to the output of the filter; and
   a transconductor to sense a voltage across the resistor to either source or sink additional input current at the input of the filter in proportion to the voltage.

2. The filter of claim 1 wherein action of the transconductor and the capacitor are to provide a larger capacitance than the capacitor alone.

3. The filter of claim 2 further comprising an amplifier coupled between the input and the output of the filter to receive pulses at the input, wherein the capacitor and resistor are in the series-feedback path of the amplifier, and
   wherein the filter is to integrate the pulses and generate a control voltage at the output related to a width of the pulses.

4. The filter of claim 3 wherein the resistor is to provide a zero for the loop filter, and wherein the larger capacitance is to provide a pole for the filter.

5. The filter of claim 4 wherein the capacitor in the series-feedback path is a first capacitor, and wherein the filter further comprises a second capacitor in a parallel feedback path of the amplifier coupled between the input and the output of the filter, wherein the second capacitor is to provide an additional pole of the filter.

6. The filter of claim 5 wherein a frequency of the additional pole is greater than a frequency of the pole provided by the larger capacitance, and wherein the first and second capacitors have approximately the same capacitance value.

7. The filter of claim 2 wherein the filter is a loop filter for a frequency synthesizer, and
   wherein the loop filter is to generate a control voltage for a voltage-controlled oscillator coupled to the output of the filter.

8. The filter of claim 3 wherein the filter is a loop filter for a frequency synthesizer, wherein the amplifier is to provide a control voltage for a voltage-controlled oscillator coupled to the output of the filter,
   wherein the pulses have varying width and are received by the amplifier from a charge pump coupled to the input of the filter, and
   wherein a width of the pulses is approximately proportional to an offset of the voltage-controlled oscillator.

9. The filter of claim 5 further comprising a filter network at an output of the amplifier to provide a higher frequency pole of the filter.

10. A filter having an input and an output comprising:
    an operational amplifier having an input coupled to the input of the filter and having an output coupled to the output of the filter;
    a feedback path capacitor coupled to the input of the amplifier and in a feedback path of the amplifier; and
    a current mirror coupled to the input and the output of the amplifier in the feedback path of the amplifier to either source or sink additional input current proportional to current through the feedback path capacitor,
    wherein the current mirror and the feedback path capacitor provide a larger capacitance than the feedback path capacitor alone.

11. The filter of claim 10 wherein the feedback path comprises the feedback path capacitor and a resistor in series coupled between the input and the output of the amplifier,
    wherein the current mirror is part of a transconductor to sense a voltage across the resistor, and
    wherein transconductor is to either source or sink the additional input current proportional to the sensed voltage.

12. The filter of claim 11 wherein the operational amplifier has a second input that is coupled to a reference voltage and wherein the amplifier is to receive pulses of varying width from a charge pump, and
    wherein the filter is to integrate the pulses and generate a control voltage related to the width of the pulses.

13. The filter of claim 11 wherein the feedback path is a first feedback path,
    wherein the filter further comprises a second capacitor in a second feedback path of the amplifier, the second feedback path being in parallel to the first feedback path,
    wherein the resistor is to provide a zero for the filter,
    wherein the larger capacitance is to provide a pole for the filter,
    wherein the second capacitor is to provide an additional pole of the filter, and
    wherein a frequency of the additional pole is greater than a frequency of the pole provided by the larger capacitance.

14. The filter of claim 13 wherein the first and second capacitors have approximately the same capacitance.

15. A method comprising: receiving pulses with an operational amplifier having a capacitor and resistor coupled between an input and an output of the amplifier in a series-feedback path of the amplifier, the capacitor being coupled to the input, the resistor being coupled to the output;
    sensing, with a transconductor, a voltage across the resistor to either source or sink additional input current at the input in proportion to the voltage; and
    lowering a frequency of a pole provided by the capacitor by generating a larger capacitance resulting from the either sourcing or sinking current by operation of the transconductor.

16. The method of claim 15 wherein the amplifier, capacitor, resistor and transconductor comprise a filter having an input and an output coupled respectively to the input and the output of the amplifier,
    wherein the pulses have a varying width and are received at the input of the filter, and wherein the method further comprises:

integrating the pulses to generate a control voltage at the output of the filter related to the width of the pulses.

17. The method of claim 16 wherein receiving comprises receiving the pulses from a charge pump coupled to the input of the filter, wherein sensing comprises sensing the voltage across the resistor to either source or sink additional input current for the charge pump, wherein the method further comprises providing the control voltage to a voltage-controlled oscillator coupled to the output of the filter, and wherein the width of the pulses is related to an offset of the voltage-controlled oscillator.

18. A frequency synthesizer comprising:

a charge pump; and a loop filter having an input and an output and comprising a capacitor and resistor coupled between the input and the output in a series-feedback path, the capacitor being coupled to the input and the resistor being coupled to the output, wherein an output of the charge pump is coupled to the input of the loop filter, wherein the loop filter further comprises transconductor to sense a voltage across the resistor to either source or sink additional current at the input of the filter, the additional current being proportional to the sensed voltage, wherein the transconductor and the capacitor provide a larger capacitance than the capacitor alone.

19. The frequency synthesizer of claim 18 wherein the charge pump is to provide pulses of varying pulse width to the loop filter, wherein the loop filter is to integrate the pulses to generate a control voltage at the output of the loop filter related to the width of the pulses, wherein the frequency synthesizer further comprises a voltage-controlled oscillator coupled to the output of the loop filter to receive the control voltage from the loop filter and to generate a frequency output, and wherein the width of the pulses is related to an offset of the frequency output.

20. The frequency synthesizer of claim 19 wherein the loop filter further comprises an operational amplifier coupled between the input and the output of the loop filter and having a first input to receive the pulses from the charge pump and having a second input to receive a reference voltage, and wherein the capacitor and resistor are in the series-feedback path of the amplifier.

21. The frequency synthesizer of claim 20 wherein the resistor is to provide a zero for the loop filter, wherein the larger capacitance is to provide a first pole for the filter, and wherein operation of the transconductor lowers a frequency of the first pole.

22. The frequency synthesizer of claim 20 wherein the frequency synthesizer is a fractional-N frequency synthesizer, wherein the frequency synthesizer further comprises divide by fractional N circuitry to receive the frequency output from the voltage-controlled oscillator and divide the frequency output by a non-integer value, and wherein N is a positive odd integer.

23. The frequency synthesizer of claim 20 further comprising divide by N circuitry to receive the frequency output from the voltage-controlled oscillator and divide the frequency output by N, wherein N is a positive even integer.

24. A wireless communication device comprising:

a frequency synthesizer to generate a reference frequency; and a transceiver to process received radio-frequency signals using the reference frequency, wherein the frequency synthesizer comprises a charge pump and a loop filter coupled to an output of the charge pump, the loop filter having an input and an output and comprising a capacitor and resistor coupled between the input and the output of the loop filter in a series-feedback path, the capacitor coupled to the input of the loop filter and the resistor coupled to the output of the loop filter, the loop filter further comprising a transconductor to sense a voltage across the resistor to either source or sink additional input current at the input of the filter, the additional current being proportional to the sensed voltage, and wherein by operation of the transconductor and the capacitor are to provide a larger capacitance than the capacitor alone.

25. The device of claim 24 wherein the charge pump is to provide pulses of varying pulse width to the loop filter, and wherein the loop filter is to integrate the pulses to generate a control voltage at the output of the loop filter related to the width of the pulses, wherein the frequency synthesizer further comprises a voltage-controlled oscillator to receive the control voltage from the loop filter and to generate a frequency output, wherein the width of the pulses is related to an offset of the frequency output, and wherein the loop filter further comprises an operational amplifier coupled to a reference voltage and coupled between the input and the output of the filter to receive the pulses from the charge pump, and wherein the capacitor and resistor are in the series-feedback path of the amplifier.

26. The device of claim 24 wherein the transceiver comprises a direct down conversion receiver, and wherein the reference frequency comprises a radio frequency signal for use in down-converting received radio frequency signals to signals of substantially zero frequency.

27. The device of claim 24 wherein the transceiver comprises a superheterodyne receiver and wherein the reference frequency is a local-oscillator frequency and is used to down-convert a received radio frequency signal to one or more intermediate frequency signals.

28. The device of claim 24 wherein the transceiver comprises a polar transmitter to generate a phase component from the reference frequency, the phase component to be used to generate a polar-modulated radio frequency signal to transmit a code-division multiplexed communication signal.

29. The device of claim 24 wherein the transceiver comprises a digital transceiver to transmit phase modulated signals using a phase reference generated from the reference frequency.

30. A system comprising:

a substantially omnidirectional antenna to receive radio frequency signals;

a frequency synthesizer to generate a reference frequency; and a transceiver to either downconvert or upconvert the signals received by the antenna using the reference frequency, wherein the frequency synthesizer comprises a charge pump and a loop filter coupled to an output of the charge pump, the loop filter having an input and an output and comprising a capacitor and resistor coupled between the input and the output of the loop filter in a series-feedback path, the capacitor coupled to the input of the loop filter and the resistor coupled to the output of the loop filter, the loop filter further comprising a transconductor to sense a voltage across the resistor to either source or sink additional input current at the input of the filter, the additional current being proportional to the sensed voltage, and wherein by operation of the transconductor and the capacitor are to function as a larger capacitance than the capacitor alone.

31. The system of claim 30 wherein the charge pump is to provide pulses of varying pulse width to the loop filter, and wherein the loop filter is to integrate the pulses to generate a control voltage related to the width of the pulses.

32. The system of claim 31 wherein the frequency synthesizer further comprises a voltage-controlled oscillator to receive the control voltage from the loop filter and to generate a frequency output, wherein the width of the pulses is related to an offset of the frequency output, and wherein the loop filter further comprises an operational amplifier coupled to a reference voltage, the amplifier to receive the pulses from the charge pump, and wherein the capacitor and resistor are in the series-feedback path of the amplifier.

* * * * *